(12) United States Patent
Cramer et al.

(10) Patent No.: US 9,182,682 B2
(45) Date of Patent: Nov. 10, 2015

(54) INSPECTION METHOD AND APPARATUS, LITHOGRAPHIC APPARATUS, LITHOGRAPHIC PROCESSING CELL AND DEVICE MANUFACTURING METHOD

(75) Inventors: Hugo Augustinus Joseph Cramer, Eindhoven (NL); Paul Christiaan Hinnen, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 603 days.

(21) Appl. No.: 13/140,292

(22) PCT Filed: Dec. 17, 2009

(86) PCT No.: PCT/EP2009/067403
§ 371 (c)(1),
(2), (4) Date: Jun. 16, 2011

(87) PCT Pub. No.: WO2010/076232
PCT Pub. Date: Jul. 8, 2010

(65) Prior Publication Data
US 2011/0249247 A1    Oct. 13, 2011

Related U.S. Application Data

(60) Provisional application No. 61/141,410, filed on Dec. 30, 2008.

(51) Int. Cl.
*G03B 27/68* (2006.01)
*G03F 7/20* (2006.01)
(Continued)

(52) U.S. Cl.
CPC .............. *G03F 7/70683* (2013.01); *G03F 1/14* (2013.01); *G03F 1/44* (2013.01); *G03F 7/70625* (2013.01); *G03F 7/70641* (2013.01); Y10T 428/24802 (2015.01)

(58) Field of Classification Search
CPC .......... G03F 1/14; G03F 1/44; G03F 7/70625; G03F 7/70641; G03F 7/70683
USPC .......................... 355/55, 52; 430/5; 428/195.1
See application file for complete search history.

(56) References Cited

U.S. PATENT DOCUMENTS

| 5,783,833 A | 7/1998 | Sugaya et al. |
| 6,674,511 B2 | 1/2004 | Nomura et al. |

(Continued)

FOREIGN PATENT DOCUMENTS

| EP | 1 628 164 A2 | 2/2006 |
| JP | 06-120118 A | 4/1994 |

(Continued)

OTHER PUBLICATIONS

English-Language Abstract for Japanese Patent Publication No. 2001-250760 A, published Sep. 14, 2001; 1 page.

(Continued)

*Primary Examiner* — Deoram Persaud
(74) *Attorney, Agent, or Firm* — Sterne, Kessler, Goldstein & Fox P.L.L.C

(57) ABSTRACT

In order to determine whether an exposure apparatus is outputting the correct dose of radiation and a projection system of the exposure apparatus is focusing the radiation correctly, a test pattern is used on a mask for printing a specific marker onto a substrate. This marker may be measured by an inspection apparatus, such as, for example, a scatterometer to determine whether errors in focus, dose, and other related properties are present. The test pattern is arranged such that changes in focus and dose may be easily determined by measuring properties of a pattern that is exposed using the mask. The test pattern of the mask is arranged so that it gives rise to a marker pattern on the substrate surface. The marker pattern contains structures that have at least two measurable side wall angles. Asymmetry between side wall angles of a structure is related to focus (or defocus) of the exposure radiation from the exposure apparatus. The extent of defocus may thereby be determined by measuring an asymmetry in side wall angle of the printed marker pattern structures.

13 Claims, 6 Drawing Sheets

(51) Int. Cl.
*G03F 1/00* (2012.01)
*G03F 1/44* (2012.01)

(56) References Cited

U.S. PATENT DOCUMENTS

| | | | |
|---|---|---|---|
| 6,833,309 B2 | 12/2004 | Fukuda | |
| 6,879,400 B2* | 4/2005 | Ausschnitt et al. | 356/401 |
| 6,975,399 B2 | 12/2005 | Fukui | |
| 7,382,447 B2 | 6/2008 | Mieher et al. | |
| 7,414,713 B2 | 8/2008 | Yamamoto | |
| 7,495,782 B2 | 2/2009 | Finarov et al. | |
| 7,573,584 B2 | 8/2009 | Den Boef et al. | |
| 7,599,064 B2 | 10/2009 | Mos et al. | |
| 7,710,572 B2 | 5/2010 | Mos et al. | |
| 7,771,905 B2 | 8/2010 | Sentoku et al. | |
| 7,791,727 B2 | 9/2010 | Den Boef et al. | |
| 7,911,612 B2 | 3/2011 | Kiers et al. | |
| 7,916,284 B2 | 3/2011 | Dusa et al. | |
| 8,313,877 B2* | 11/2012 | Chung | 430/22 |
| 2002/0155356 A1* | 10/2002 | Fujimoto | 430/5 |
| 2003/0048458 A1 | 3/2003 | Mieher et al. | |
| 2004/0058256 A1* | 3/2004 | Fujisawa et al. | 430/30 |
| 2004/0059540 A1* | 3/2004 | Matsumoto et al. | 702/150 |
| 2004/0190008 A1 | 9/2004 | Mieher et al. | |
| 2006/0250598 A1 | 11/2006 | Sasaki | |
| 2007/0050749 A1 | 3/2007 | Ye et al. | |
| 2007/0052948 A1 | 3/2007 | Den Boef et al. | |
| 2008/0018874 A1* | 1/2008 | Dusa et al. | 355/55 |
| 2008/0043239 A1* | 2/2008 | Boef et al. | 356/401 |
| 2008/0180647 A1 | 7/2008 | Sugino | |
| 2009/0147247 A1 | 6/2009 | Endo et al. | |
| 2010/0233599 A1* | 9/2010 | Hinnen et al. | 430/30 |
| 2010/0328636 A1* | 12/2010 | Quaedackers et al. | 355/53 |
| 2012/0044472 A1 | 2/2012 | Den Boef et al. | |
| 2012/0327383 A1* | 12/2012 | Cao et al. | 355/67 |

FOREIGN PATENT DOCUMENTS

| | | |
|---|---|---|
| JP | 08-213306 A | 8/1996 |
| JP | 10-154647 A | 6/1998 |
| JP | 2000-077295 A | 3/2000 |
| JP | 2000-114158 A | 4/2000 |
| JP | 2001-250760 A | 9/2001 |
| JP | 03-297423 B2 | 7/2002 |
| JP | 2005-109016 A | 4/2005 |
| JP | 2005-513757 A | 5/2005 |
| JP | 2006-060214 A | 3/2006 |
| JP | 2006-313866 A | 11/2006 |
| JP | 2008-028389 A | 2/2008 |
| JP | 2008-182097 A | 8/2008 |
| TW | 200737295 A | 10/2007 |
| TW | 200739276 A | 10/2007 |
| TW | 200813654 A | 3/2008 |
| TW | 200821770 A | 5/2008 |
| TW | 200832584 A | 8/2008 |
| WO | WO 2008/015973 A1 | 2/2008 |

OTHER PUBLICATIONS

English-Language Abstract for Japanese Patent Publication No. 06-120118 A, published Apr. 28, 1994; 1 page.

English-Language Abstract for Japanese Patent Publication No. 10-154647 A, published Jun. 9, 1998; 1 page.

English-Language Abstract for Japanese Patent Publication No. 2000-114158 A, published Apr. 21, 2000; 1 page.

Hung, K., et al., "Scatterometry Measurements of Line End Shortening Structures for Focus-Exposure Monitoring," *Proc. of SPIE 6152*:6152W-1-6152W-12, Metrology, Inspection, and Process Control for Microlithography XX (2006).

Yuito, T., et al., "Fresnel diffraction mask for focus monitoring," *J. Vac. Sci. Technol.* 22(3):977-980, American Vacuum Society (2004).

International Search Report directed to related International Application No. PCT/EP2009/067403, mailed Jul. 22, 2010 from the European Patent Office, Rijswijk, Netherlands; 4 pages.

International Preliminary Report on Patentability and Written Opinion of the International Searching Authority directed to related International Patent Application No. PCT/EP2009/067403, mailed Jul. 5, 2011 from the International Bureau of WIPO, Geneva, Switzerland; 9 pages.

English-Language Abstract for Taiwanese Patent Publication No. 200737295 A, published Oct. 1, 2007; 1 page.

International Search Report directed to related International Patent Application No. PCT/EP2010/056016, mailed Aug. 26, 2010, from the European Patent Office; 3 pages.

International Preliminary Report on Patentability with the Written Opinion of the International Searching Authority directed to related International Patent Application No. PCT/EP2010/056016, issued Nov. 15, 2011, from the International Bureau of WIPO; 9 pages.

Non-Final Rejection mailed Dec. 18, 2013 for U.S. Appl. No. 13/264,256, filed Oct. 13, 2011; 9 pages.

Notice of Allowance mailed May 20, 2014 for U.S. Appl. No. 13/264,256, filed Oct. 13, 2011; 7 pages.

* cited by examiner focus

INSPECTION METHOD AND APPARATUS, LITHOGRAPHIC APPARATUS, LITHOGRAPHIC PROCESSING CELL AND DEVICE MANUFACTURING METHOD

CROSS-REFERENCE TO RELATED APPLICATIONS

This application claims the benefit of U.S. provisional application 61/141,410, which was filed on Dec. 30, 2008, and which is incorporated herein in its entirety by reference.

FIELD

Embodiments of the present invention relate to methods of inspection that may be used, for example, in the manufacture of devices by lithographic techniques and to methods of manufacturing devices using lithographic techniques, as well as to apparatus used to carry out the methods.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a "mask" or a "reticle," may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (i.e., resist) provided on the substrate. In general, a single substrate will contain a network of adjacent target portions that are successively patterned. Known lithographic apparatus include so-called "steppers," in which each target portion is irradiated by exposing an entire pattern onto the target portion at one time, and so-called "scanners," in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is necessary to measure parameters of the patterned substrate such as, for example, the overlay error between successive layers formed in or on it. There are various techniques for making measurements of the microscopic structures formed in lithographic processes, including the use of scanning electron microscopes and various specialized tools. One form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known—spectroscopic scatterometers and angularly-resolved scatterometers. Spectroscopic scatterometers direct a broadband radiation beam onto the substrate and measure the spectrum (intensity as a function of wavelength) of the radiation scattered into a particular narrow angular range. Angularly-resolved scatterometers use a monochromatic radiation beam and measure the intensity of the scattered radiation as a function of angle.

Scatterometers may be used to measure several different aspects of lithographic apparatuses, including their substrate orientation and exposure efficacy. Two important parameters of a lithographic apparatus (and specifically, of the exposure action that the lithographic apparatus carries out) that may also be measured by scatterometers are focus and dose. A lithographic apparatus has an exposure apparatus that includes a radiation source and a projection system as mentioned below. The radiation source provides a beam of radiation and the projection system focuses the beam of radiation and applies a pattern to the beam to create a patterned beam of radiation that strikes the resist on the substrate surface.

The dose of radiation that is projected onto a substrate in order to expose it is controlled by various parts of the exposure apparatus. It is mostly the projection system of the lithographic apparatus that is responsible for the focus of the radiation onto the correct portions of the substrate. It is important that the focusing of the image of the pattern in the patterned radiation occurs at the surface of the substrate where the exposure occurs. This is so that the sharpest (i.e., most focused) image will occur on the surface of the substrate and the sharpest pattern possible may be exposed thereon. This enables smaller product patterns to be printed.

The focus and dose of the radiation directly affect various parameters of the patterns or structures that are exposed on the substrate. Parameters that can be measured using a scatterometer are physical properties of structures within the patterns that have been printed onto a substrate. These parameters may include the critical dimension (CD) or side wall angle (SWA). The critical dimension is effectively the mean width of a structure such as a bar (or a space, dot or hole, depending on what the measured structures are that are in the printed pattern). The side wall angle is the angle between the surface of the substrate and the rising (or falling) portion of the structure.

In addition, mask shape corrections (focus corrections for bends in a mask) can be applied if scribe lane structures are used with a product mask for focus measurements.

Focus and dose may be determined simultaneously by scatterometry (or scanning electron microscopy) from a one-dimensional structure in the mask pattern (which gives rise to a one-dimensional pattern on the substrate, from which measurements are taken). A single structure can be used as long as that structure, when exposed and processed, has a unique combination of critical dimension and side wall angle measurements for each point in a focus energy matrix (FEM). If these unique combinations of critical dimension and side wall angle are available, the focus and dose values can be uniquely determined from these measurements.

However, there is a problem with this use of one-dimensional structures. There are generally several combinations of focus and dose that result in similar critical dimension and side wall angle measurements. This means that focus and dose cannot be determined uniquely by measuring a single one-dimensional structure. It has been considered to use more than one structure in separate adjacent markers to resolve this ambiguity. However, having a plurality of markers incorporating different structures has disadvantages, including occupying potentially valuable space on the substrate surface.

A focus offset or error during the exposure of a pattern on a target portion of a substrate can be measured only indirectly. For example, to measure the side wall angle, the whole profile of the pattern on the target is reconstructed. The focus is then derived after calibrating a model that describes, for example, side wall angle and critical dimension as a function of focus and dose. This technique is known as focus-dose separation.

The scatterometry signal sensitivity towards variations in side wall angle (and CD) gives rise to derivations of focus (and dose) values. However, the sensitivity of the scatterometry signal (i.e., the reflected radiation that contains information regarding the surface from which the radiation was reflected) is affected by the thickness of the radiation sensitive material (i.e., resist) on the substrate surface. In fact, the sensitivity of the scatterometry signal may scale with the inverse square of the resist thickness.

A decreased sensitivity may lead to the following unwanted effects: although the sensitivity level may decrease, the noise level does not decrease and as a result, the signal-to-noise ratio decreases and the side wall angle reproducibility may deteriorate accordingly; as modeling errors remain the same, this may lead to increased systematic accuracy errors in the side wall angle measurements; and, resist heights variations, or other variations in a stack that is part of the modeled pattern, may give rise to an undesired impact on the side wall angle measurements (also known as cross-talk).

The above-mentioned unwanted effects may have a direct impact on the focus values derived from the side wall angle.

SUMMARY

It is desirable to provide improved focus metrology. In particular, it is desirable to obtain accurate focus values even when resist thickness is reduced.

According to an embodiment of the present invention, a method of measuring a focus-related property of an exposure apparatus includes the following: printing a pattern on a substrate surface using (i) the exposure apparatus to be measured and (ii) a patterning device including a pattern for creating the printed pattern, the patterning device pattern being designed to give rise to the printed pattern having a structure that varies with a variation in a focus-related property of the exposure apparatus; projecting a radiation beam onto the printed pattern on the substrate surface; detecting radiation reflected from the printed pattern on the substrate surface; measuring, using the detected radiation, an asymmetry in the printed pattern; and determining, from the asymmetry, the focus-related property of the exposure apparatus. Specifically, the side wall angle measurements on different side walls of the structure may vary differently from each other when there is variation in a focus-related property of the exposure apparatus. The asymmetry may therefore be a difference between the two side wall angle measurements.

According to another embodiment of the present invention, a mask for use in an exposure apparatus includes a pattern for printing a pattern on a substrate, the mask pattern being arranged such that the printed pattern contains one or more structures with side wall angle measurements that vary (e.g., different measurements for various portions of the same structure) with a variation in a focus-related property of the exposure apparatus.

According to another embodiment of the present invention, a substrate includes a pattern printed on its surface, the printed pattern containing one or more structures with side wall angle measurements that vary (e.g., different measurements for various portions of the same structure) with a variation in a focus-related property of an exposure apparatus used to print the pattern.

According to another embodiment of the present invention, a projection apparatus for use in an exposure apparatus is configured to print a pattern on a substrate using a mask that contains a pattern for printing the printed pattern, the projection apparatus being configured to resolve the pattern of the mask on the substrate in such a way that the printed pattern contains one or more structures with side wall angle measurements that vary (e.g., different measurements for various portions of the same structure) with a variation in a focus-related property of the exposure apparatus.

According to another embodiment of the present invention, an inspection system for measuring focus-related properties of an exposure apparatus includes the following: a patterning device including a pattern for printing a pattern on a substrate using the exposure apparatus to be measured, the printed pattern (e.g., having side wall angle measurements) that varies with a variation in a focus-related property of the exposure apparatus; and, an inspection apparatus. The inspection apparatus is configured to: project a radiation beam onto the printed pattern on the substrate; detect radiation reflected from the printed pattern on the substrate; measure, using the detected radiation, an asymmetry in the pattern (e.g., by measuring side wall angle of two sides of a structure within the printed pattern); and, determine, from the pattern asymmetry (e.g., an asymmetry in the two side wall angles), the focus-related property of the exposure apparatus.

Further features and advantages of the invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate embodiments of the present invention and, together with the description, further serve to explain the principles of the invention and to enable a person skilled in the relevant art(s) to make and use the invention.

Figure 1:
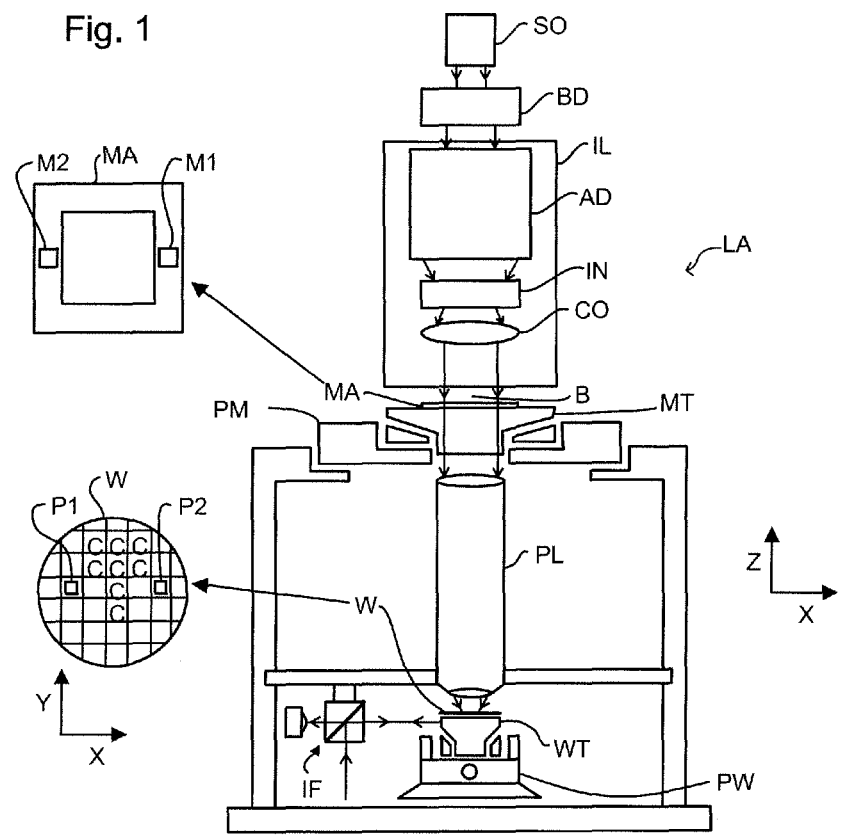
FIG. 1 is an illustration of a lithographic apparatus, in which embodiments of the present invention may be implemented.

The features and advantages of embodiments of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; and, flash memory devices. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 is an illustration of a lithographic apparatus, in which embodiments of the present invention may be implemented. The apparatus includes the following: an illumination system (illuminator) IL configured to condition a radiation beam B (e.g., UV radiation or DUV radiation); a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and, a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports (i.e., bears the weight of, the patterning device). It holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic, or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As depicted herein, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index (e.g., water) so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example, when the source is a mercury lamp. The source SO and the illuminator IL, together with the beam delivery system BD if required, may be referred to as a "radiation system."

The illuminator IL may comprise an adjuster AD for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL may comprise various other components, such as an integrator IN and a condenser CO. The illuminator may be used to condition the radiation beam for a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder, or capacitive sensor), the substrate table WT can be moved accurately (e.g., so as to position different target portions C in the path of the radiation beam B). Similarly, the first positioner PM and another position sensor (which is not illustrated in FIG. 1) can be used to accurately position the mask MA with respect to the path of the radiation beam B (e.g., after mechanical retrieval from a mask library or during a scan). In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The illustrated apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the x- and/or y-direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type referred to above.

Combinations and/or variations on the above described modes of use or entirely different modes of use may also be employed.

Figure 2:
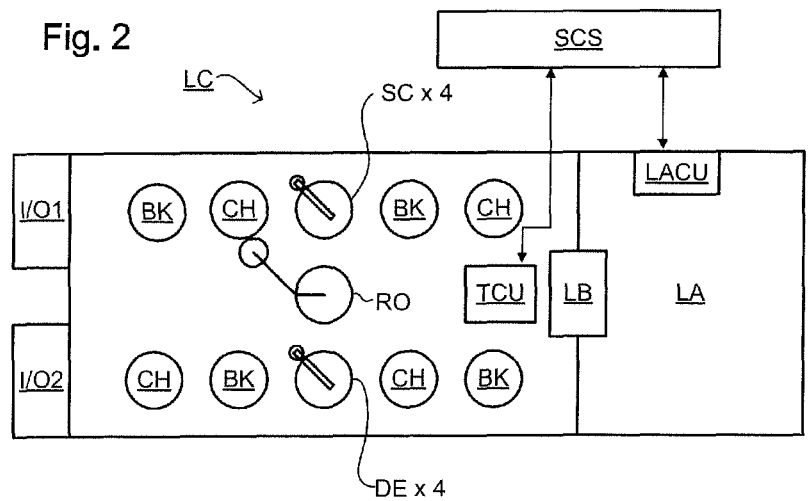
FIG. 2 is an illustration of a lithographic cell or cluster, in which embodiments of the present invention may be implemented.

As shown in FIG. 2, the lithographic apparatus LA forms part of a lithographic cell LC, also sometimes referred to a "lithocell" or "cluster," which also includes apparatus to perform pre- and post-exposure processes on a substrate. Conventionally, the lithocell includes spin coaters SC to deposit resist layers, developers DE to develop exposed resist, chill plates CH, and bake plates BK. A substrate handler, or robot RO, picks up substrates from input/output ports I/O1, I/O2, moves them between the different process apparatus, and delivers them to the loading bay LB of the lithographic apparatus. These devices, which are often collectively referred to as the "track," are under the control of a track control unit TCU which is itself controlled by the supervisory control system SCS, which also controls the lithographic apparatus via lithography control unit LACU. Thus, the different apparatus can be operated to maximize throughput and processing efficiency.

In order to ensure that substrates exposed by the lithographic apparatus are exposed correctly and consistently, it is desirable to inspect exposed substrates to measure properties such as overlay errors between subsequent layers, line thicknesses, critical dimensions and (CD). If errors are detected, adjustments may be made to exposures of subsequent substrates, especially if the inspection can be done prior to the exposure of subsequent substrates in the same batch. Also, already-exposed substrates may be stripped and reworked to improve yield or discarded, thereby avoiding exposures on substrates known to be faulty. In a case where only some target portions of a substrate are faulty, further exposures can be performed only on those target portions which are good.

An inspection apparatus is used to determine the properties of the substrates, and in particular, to determine how the properties of different substrates or different layers of the same substrate vary from layer to layer. The inspection apparatus may be integrated into the lithographic apparatus LA or the lithocell LC or may be a stand-alone device. To enable rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatus have sufficient sensitivity to accurately measure the latent image. Therefore, measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

Figure 3:
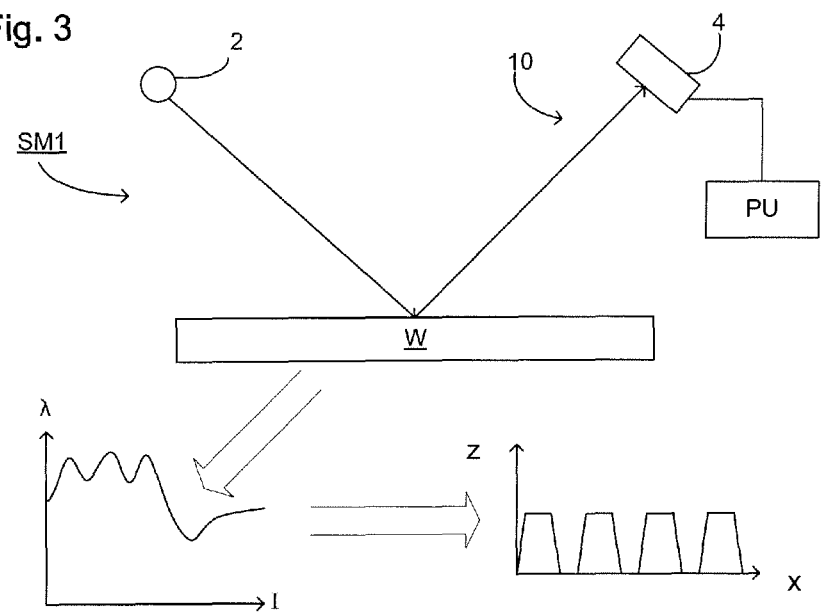
FIG. 3 is an illustration of a first scatterometer, in which embodiments of the present invention may be implemented.

FIG. 3 is an illustration of a scatterometer SM1, in which embodiments of the present invention may be implemented. Scatterometer SM1 includes a broadband (white light) radiation projector 2 which projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU (e.g., by Rigorous Coupled Wave Analysis and non-linear regression or by comparison with a library of simulated spectra as shown at the bottom of FIG. 3). In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
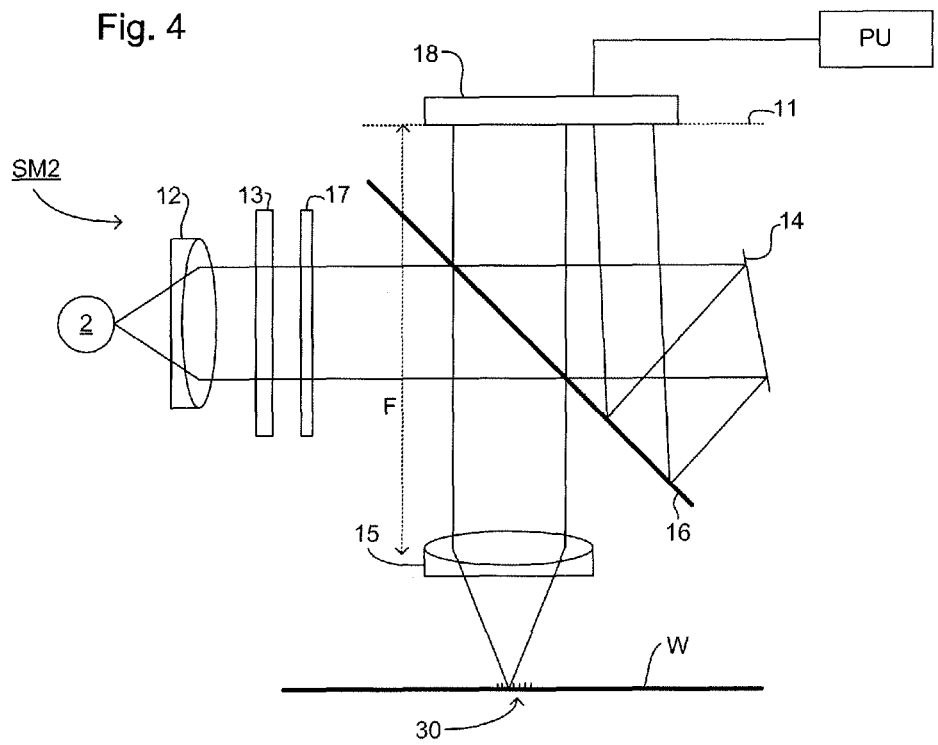
FIG. 4 is an illustration of a second scatterometer, in which embodiments of the present invention may be implemented.

Another scatterometer SM2, in which embodiments of the present invention may be implemented, is illustrated in FIG. 4. In this device, the radiation emitted by radiation source 2 is focused using lens system 12 through interference filter 13 and polarizer 17, reflected by partially reflected surface 16 and is focused onto substrate W via a microscope objective lens 15, which has a high numerical aperture (NA) (e.g., at least 0.9 and at least 0.95). Immersion scatterometers may even have lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15; however, the pupil plane may instead be re-imaged with auxiliary optics (not shown) onto the detector. The pupil plane is the plane in which the radial position of radiation defines the angle of incidence and the angular position defines azimuth angle of the radiation. The detector may be a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used, for example, to measure the intensity of the incident radiation. To do this, when the radiation beam is incident on the beam splitter 16, part of the radiation beam is transmitted through the beam splitter as a reference beam towards a reference mirror 14. The reference beam is then projected onto a different part of the same detector 18.

A set of interference filters 13 is available to select a wavelength of interest in the range of, for example, 405-790 nm or even lower, such as, for example, 200-300 nm. The interference filter may be tunable rather than comprising a set of different filters. A grating could be used instead of interference filters.

The detector 18 may measure the intensity of scattered light at a single wavelength (or narrow wavelength range) and the intensity separately at multiple wavelengths or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths) is possible, which gives a large etendue, allowing the mixing of multiple wavelengths. The plurality of wavelengths in the broadband preferably each has a bandwidth of $\lambda$ and a spacing of at least $2\lambda$ (i.e., twice the bandwidth). Several "sources" of radiation can be different portions of an extended radiation source that have been split using fiber bundles. In this way, angle resolved scatter spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP 1,628,164A.

Figure 5:
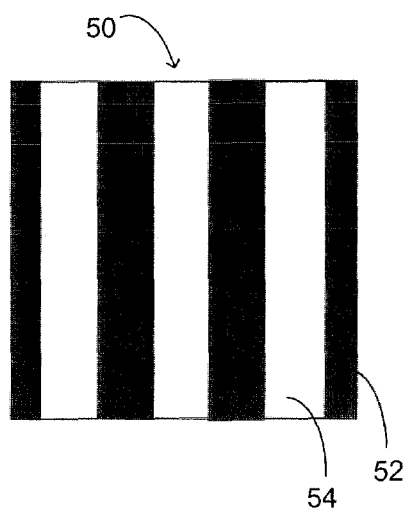
FIG. 5 is an illustration of a target pattern in the shape of a standard grating.

The target 30 on substrate W may be a grating 50 such as that illustrated in FIG. 5, which is printed to form solid resist lines with bars 52. The bars 52 may alternatively be etched into the substrate. This pattern is sensitive to chromatic aberrations in the lithographic projection apparatus (particularly, the projection system PL) and illumination symmetry and the presence of such aberrations may manifest themselves into variations in the printed grating. Accordingly, the scatterometry data of the printed gratings is used to reconstruct the gratings. The parameters of the grating, such as line widths and shapes, may be input to the reconstruction process performed by processing unit PU from knowledge of the printing step and/or other scatterometry processes.

Embodiments of the present invention relate to a pattern for use in a patterning device in an exposure apparatus. The exposure apparatus may incorporate a radiation source, a patterning device, and a projection apparatus as described above. The patterning device may include a mask. The mask of the exposure apparatus may be a transmissive mask, or it may be a reflective mask such as a plurality of individually controllable elements (e.g., mirrors) as described above. This mask is used by the exposure apparatus to print a pattern on a target portion of a substrate surface. The printed pattern on the substrate is measured using an inspection apparatus such as, for example, a scatterometer or an ellipsometer. Further, other types of inspection apparatus may be used as long as they are capable of measuring radiation reflected from a printed pattern or structure and capable of determining from this measured radiation the following: a parameter of the pattern such as critical dimension (CD) of individual structures within the printed pattern; and, side wall angle (SWA) of the same structures; or asymmetry of the structure.

The properties of the reflected radiation from the pattern on the substrate are compared with mathematical models or libraries of previous measurements or simulations. This comparison may be used to obtain the particular relationship between the pattern on the substrate and focus and/or dose.

The focus- and/or dose-related properties that are determined may be focus offset (which may be caused by misalignment of lenses, for instance) or dose offset (caused by fluctuations in the intensity of the radiation beam, for instance). They may also be other focus-related parameters like astigmatism, contrast, and lens aberrations (typically expressed in zernikes). Alternatively, they may be illumination (i.e., radiation) parameters such as dose or intensity variation. Further, the measured properties may be parameters that have an impact on the resist that is similar to the impact caused by dose, such as local bakeplate temperature (which gives rise to similar variations over a substrate surface in reflected radiation, CD, or SWA as variations in dose over the substrate surface and resist variation (variations in resist thickness or density will give rise to variations in CD and SWA in a similar manner as variations in dose).

Embodiments of the present invention are directed to the relationship between side wall angles of a structure in a printed pattern and focus of the exposure radiation. A pattern in a patterning device (e.g., a mask) may be designed such that when a pattern is printed on a substrate using the mask pattern, the printed pattern has useful properties for the measurement of focus of the exposure (or printing) radiation. In particular, the difference in side wall angles of different portions of the printed structures may increase as defocus is increased (or as focus is decreased). More generally, the asymmetry of a target may change monotonically as a function of focus.

One embodiment of the mask pattern gives rise to a printed pattern in the form of a "semi-dense" grating. A "semi-dense" grating is a grating with a critical dimension-to-space ratio between "dense" (1:1) and "isolated" (1:7). Each side wall angle (SWA) of the semi-dense grating changes monotonically as a function of exposure focus. The pattern on a target portion of a substrate may thereby be designed to have an enhanced sensitivity of side wall angle (on one or more portions of the pattern) as a function of focus. The one or more side wall angles may be measured using scatterometry techniques.

FIG. 5 is an illustration of a grating 50 that is arranged in a one dimension array of bars 52 (note that the array of bars 52 is in one dimension and that the bars 52 are not one-dimensional themselves). The spaces between the bars 52 are labeled 54. The pattern of FIG. 5 is commonly used in measuring characteristics such as overlay and alignment of substrates W in (metrology devices of) lithographic apparatuses. However, as mentioned above, when radiation is reflected from grating 50 and parameters such as critical dimension and side wall angle are determined from the reflected radiation, there can be several combinations of focus and dose that give rise to the CD and SWA measurements that have been made. Furthermore, as also mentioned above, variation in resist thickness or underlying stack properties may cause variation in SWA measurement, which in turn gives rise to errors in focus measurement.

Figure 6:
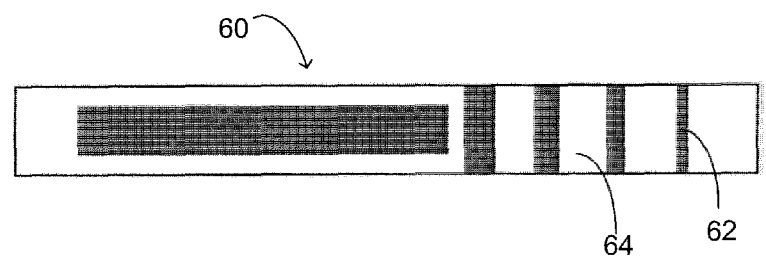
FIG. 6 is an illustration of a target pattern according to an embodiment of the present invention.

One embodiment of the present invention is a pattern 60 as illustrated in FIG. 6. The pattern 60 is a two-dimensional array of structures 62 (with spaces 64 in between the structures). A feature of the present embodiment is that the (preferably two-dimensional repeating) structures 60 may have different physical or geometric properties in the x- and y-directions. Because of the different physical or geometric properties in the x- and y-directions, each of the orientations has a significant and intentionally different response to focus and dose variations. This results in a more complex overall behavior of the printed structure than mere critical dimension and side wall angle. As a result, the overall response is unique for a given focus and dose, which enables better separation of focus and dose when compared with measurements of a single one-dimensional array. Combinations of different properties in a single repeating structure according to an embodiment of the invention enables a single pattern to be used on each target portion of the substrate surface. This means that measurements can be made on a single pattern, thus reducing space used on the mask for the pattern (as compared to using a plurality of target portions that each contain a one-dimensional array or a single structure). This also reduces space used on the substrate for the exposed pattern, as well as reducing time to take the measurements, while increasing the reduction in ambiguity of the measurement results.

The pattern 60 of FIG. 6 uses the effect that an image in the pupil plane of angular-resolved scatterometry exhibits an asymmetry in the first diffraction order if the measured grating exhibits an asymmetry (this effect is also used in scatterometry-based overlay metrology). The pupil asymmetry is easily detectable and very sensitive to grating asymmetries.

To exploit this effect, target portion patterns are provided that have a difference in left/right side wall angles as a function of focus. FIG. 6 can be viewed to be an asymmetrical pattern. The pattern shown in FIG. 6 is the pattern intended for the patterning device such as a mask. This pattern is designed to generate a printed pattern on the substrate that displays variation in side wall angle difference as a function of variation in focus. The target is preferably repeated in the x- and y-directions.

Figure 7:
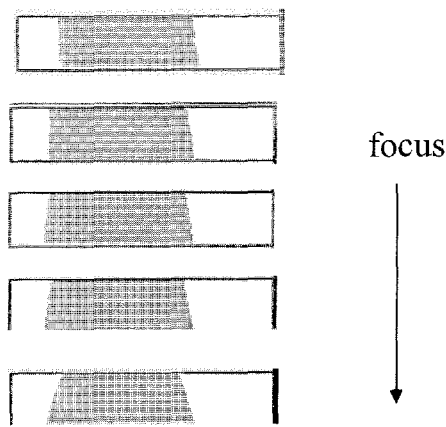
FIG. 7 is an illustration of profiles of pattern structures as a function of focus.

FIG. 7 shows calculated resist profiles of a (e.g., bar-shaped) structure in the printed pattern when the mask pattern of FIG. 6 is exposed. The left and right side wall angles (that may have been calculated or extrapolated from data in a reflected inspection beam) are shown on the left and right sides of each of the profiles. The profiles of FIG. 7 are shown with increased focus from the top profile to the bottom profile. The focus is the exposure focus (i.e., the focus of the beam used to expose or print this printed pattern). As can be seen from the profiles, as the exposure focus increases from top to bottom of the profiles shown in FIG. 7, both side wall angles of the profile increase. The side wall angles on the left and right also show smaller differences (i.e., both angles converge toward being the same angle from the substrate surface) as exposure focus is increased.

In an embodiment of the present invention the printed pattern comprises one or more structures. A change of the focus related property of the exposure apparatus will result in a change of the asymmetry of the one or more structures. Therefore it is possible to detect a change in the focus related property of the exposure apparatus if the asymmetry of the one or more structures is measured. If the measured asymmetry changes, it can be concluded that the focus related property of the exposure apparatus changes.

The structure profile may also be referred to as a resist line because the structures printed on the substrate surface may be line-shaped and constructed from resist from the exposed resist on the substrate surface.

Figure 8:
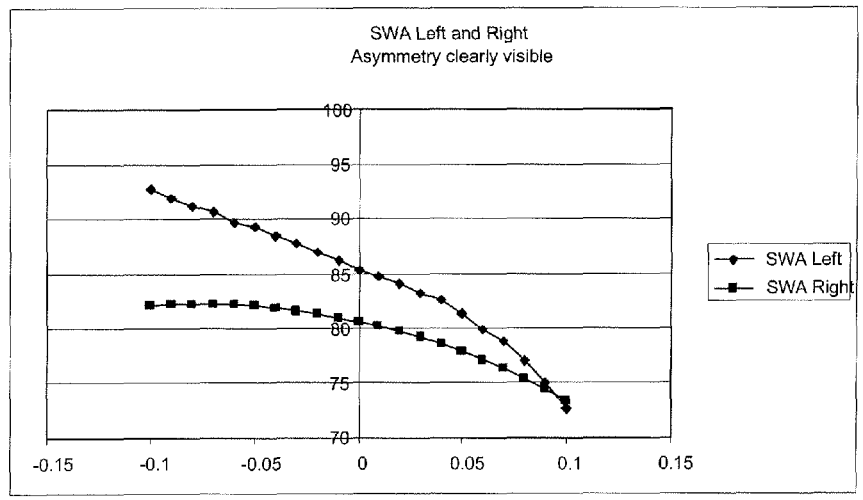
FIG. 8 is an illustration of left and right side wall angles as a function of focus.

FIG. 8 is an illustration of a graph that shows the difference between the side wall angle of the left and right sides of the structure profile. On the far left of the graph, the side wall angles of each of the left and right sides of the profiles are quite divergent. However, these converge as exposure focus increases towards the right hand side of the graph. The diamond-shaped dots represent the left side wall angle and the square-shaped dots represent the right side wall angle. The y-axis represents side wall angle and the x-axis represents focus of the exposure beam.

From FIGS. 6, 7 and 8, it is clear that the exposed pattern in this example exhibits a difference in its side wall angles as a monotonic function of exposure focus. In other words, as exposure focus decreases, the difference also decreases accordingly. There are no inflexion points for the focus range of interest shown in the graph of FIG. 8.

Angle-resolved scatterometry, as described above, may be used to determine the difference in side wall angles of a structure in the printed pattern. This will be detected as an asymmetry in the detected radiation that has been reflected from the surface of the printed pattern. The pupil asymmetry (i.e., asymmetry measured in the pupil plane of the angle-resolved scatterometer) can be measured accurately and can be very sensitive for target (i.e., printed pattern) asymmetry effects. A pattern like the one shown in FIG. 6 therefore creates a sensitive enough printed pattern to demonstrate errors in focus. The pupil asymmetry as a function of focus (and if needed, dose) can be calibrated experimentally.

The advantage of this embodiment of the present invention is that it gives rise to a side wall angle metrology that does not require a full profile reconstruction. It gives rise to high sensitivity and, because most process variations have a similar impact on both side wall angles, a greater robustness against process variations.

In another embodiment of the present invention, sensor asymmetry may be compensated for by using two gratings with opposite side wall angle difference. The difference in the side wall angle asymmetries of the two gratings may be determined and any error may be calibrated.

"Assist features" are features that are present in a mask pattern but that are not printed onto the substrate because they are not resolvable by the exposure apparatus. The structures that are not printed onto the substrate (because they are not resolvable by the exposure apparatus, or are "sub-resolution") nevertheless affect the way in which resolvable structures are printed. An embodiment of the present invention uses the effect of sub-resolution structures on pattern shape and displacement as a function of defocus. However, the present embodiment may further incorporate the following: the printed targets (consisting of, for example, periodic dual line populations as shown in FIG. 9) can be adapted to have the required sensitivity for a given scanner illumination mode (scanner illumination mode refers to an exposure apparatus mode that controls the way in which the radiation is projected; the printed targets may be close to present lithography printed resolution requirements, making targets behave more similarly to product structures and, the sign of the defocus value can be deducted from a CD-profile side wall angle.

Figure 11:
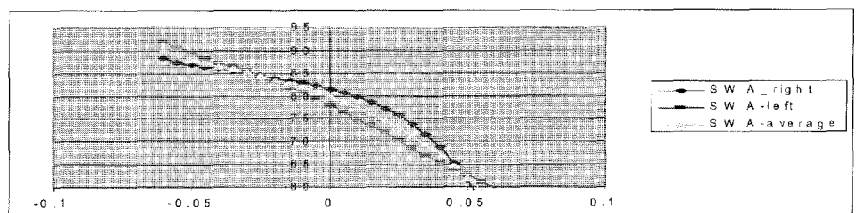
FIGS. 11 and 12 are illustrations of a comparisons of left and right side wall angle as a function of focus with overlay as a function of focus.
Figure 12:
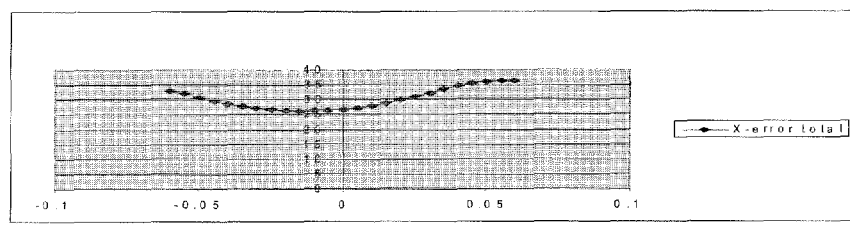

With respect to the printed targets that may be close to present lithography printed resolution requirements, FIG. 12 shows that the reconstructed overlay error (X) is symmetrical around a nominal focus. The (de)focus value of the scanner of the lithographic apparatus cannot be determined only from this overlay value (X) because sign information (i.e., too close or too far; negative or positive defocus) is lacking. The SWA value may therefore be used to determine the sign of the focus value. This is because the SWA changes monotonically as a function of focus such that, above a certain threshold, the focus must be positive and, below a certain threshold (e.g., the threshold in the graph of FIG. 11), the focus must be negative. The sign may therefore be determined from the SWA graph and applied to the overlay measurements to determine the extent (and sign) of the defocus.

Figure 9:
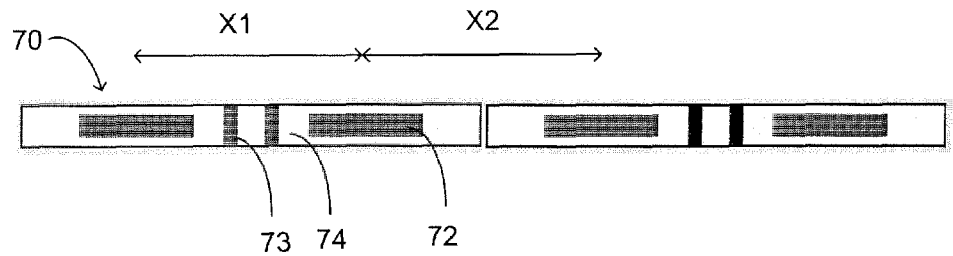
FIG. 9 is an illustration of a target pattern according to another embodiment of the present invention.

The effect of sub-resolution line displacement as a function of focus is used in a mask pattern 70 such as that shown in FIG. 9. In particular, the mask pattern 70 of FIG. 9 is designed to generate a left-right SWA asymmetry as a function of focus (similar to the mask pattern of FIG. 6). The pattern 72,74 may be repeated in the x- and y-directions.

Although the mask pattern 70 looks like a complex two-dimensional structure, the resultant printed resist lines (on the substrate surface) are simple one-dimensional structures. This is achieved because the mask features 72, 74 in the pattern 70 will not be resolved by the exposure apparatus because they are effectively sub-resolution features (i.e., the features are too small to be faithfully printed by the exposure radiation of the exposure apparatus).

Figure 10:
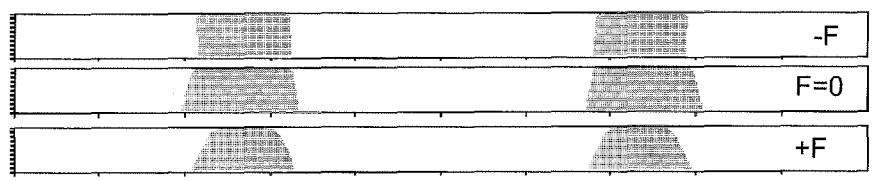
FIG. 10 is an illustration of profiles of a patterned structure as a function of focus.

FIG. 10 shows profiles of the exposed pattern on the substrate surface. The overlay error is calculated and defined as the difference between a distance between the centers of adjacent resist lines and a distance between lines placed on the mask. According to a design of the structure on a mask, a certain x-value (distance between centers of adjacent resist lines) is expected. However, depending on the focus value of the exposure apparatus, a different x-value will be measured on the substrate surface. This is called the overlay error between the left and right lines 72 of FIG. 9. The side wall angle of the printed resist lines are also measured. FIG. 10 is an illustration of these profiles as a function of defocus. The "−F" profile is a profile of a structure at a negative defocus. The "+F" profile is a profile of a structure at a positive defocus. The "F" profile is a profile of a structure in focus.

FIG. 11 shows the left and right side wall angles as a function of focus. FIG. 12 shows the overlay as a function of focus. Note that the left and right side wall angle values converge at two points and have a monotonic relationship with (de)focus.

The measured overlay error shown in FIG. 12 has a minimal value (the minimum inflexion) not equal to 0. In the example shown, the minimum is at approximately 30 mm. This is a value that may be used to ensure that the overlay information can be deducted from a dual-line population. For example, in a CD-reconstruction, this is accomplished by biasing the dual-line target patterns. The pattern 70 of FIG. 9 is repeated as shown. This means that there will be effectively a series of bars of alternating line population (lines 72 will be printed, but lines 73 are at a sub-resolution and will not be printed onto the substrate surface). The distance from the center of a bar 72 to another bar 72 in the same pattern unit may be referred to as distance "X1" as shown in FIG. 9. A distance from the center of a bar 72 in one pattern unit to a bar 72 in the next repetition of the pattern unit may be referred to as a distance "X2" as shown in FIG. 9. The value X1 may be extracted in a CD-reconstruction technique if X1 and X2 are different. In an extreme case where X1 and X2 are equal, they cannot be differentiated from one another. Biasing may therefore help to prevent this lack of differentiation in the case where X1 and X2 are equal.

This embodiment of the present invention may be used to translate measured overlay values from a CD-reconstruction dual-line population towards a focus value. Since only the sign of the defocus value is deducted from the side wall angle, and the defocus value is deducted from the overlay value, this method for focus measurements also works for resist films, where side wall angle accuracy is reduced.

Because the method does not rely on capturing first diffraction orders in the detection plane of a scatterometer, the freedom in selection of dual-line pitches is increased, where a dual-line pitch is a sum of X1 and X2.

The method described above is not sensitive to exposure apparatus telecentricity. It is therefore not sensitive to the impact of placement errors as a function of defocus. In other words, a telecentricity effect through defocus is cancelled because both lines exhibit the same displacement; the displacement being cancelled out by the differential overlay measurement of both line populations (that are exposed in a single exposure).

Figure 13:
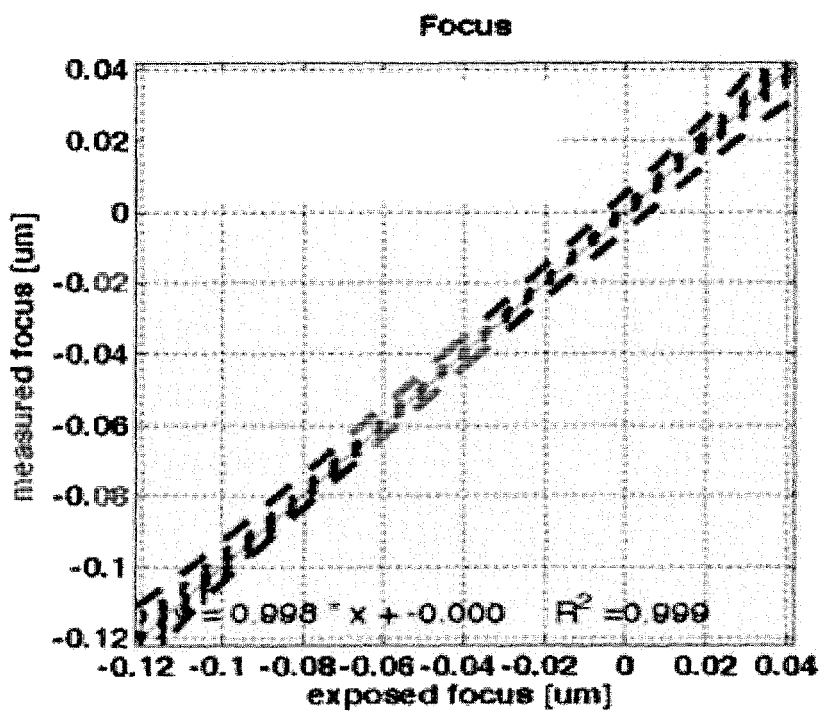
FIGS. 13 and 14 are illustrations of focus accuracy as a function of focus value.
Figure 14:
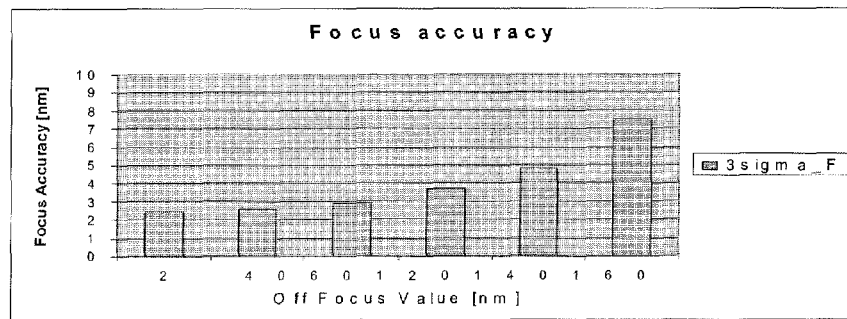

With the current focus/dose method that is based on side wall angle and mean critical dimension information, the focus/dose accuracy that can be obtained depends on the actual value of the focus. At the "Best Focus" position, the focus accuracy is best, whereas the focus accuracy deteriorates as a function of defocus. This is schematically shown in FIGS. 13 and 14. Note that at the off-focus value, the new focus/dose targets exhibit the largest sensitivity. Therefore, by adding position information at the (off-)focus measurements, the focus accuracy over the full focus capture range can be improved.

Returning specifically to FIGS. 13 and 14, these figures show focus accuracy as a function of focus value. The double broken line in FIG. 13 shows the focus accuracy as a function of defocus. FIG. 14 shows the focus accuracy as a function of focus range as evaluated. This may be understood by calculating the total standard deviation of all points as seen in FIG. 13. In FIG. 13, for example, the evaluated focus range is 0.16 microns (um).

The patterns described above are designed to be of high sensitivity to focus and dose and to be in a small process window. The product area may be within the same mask and therefore on the same field of the substrate that is printed using the same mask, and is at as low dose and focus sensitivity as possible and incorporates a large process window.

As an alternative to the bar-and-space grating layout of FIGS. 6 and 9, the two-dimensional pattern may be composed of other structures such as contact holes or any other shape that allows, for example, certain portions of the pattern to be unresolved by the exposure apparatus.

Several different pattern structures are possible and will be appreciated by a person skilled in the relevant art. The advantage of focus (and/or dose) determination with two-dimensional-repeating structures, as described above, is that the patterns can be designed to be more robust for separating focus (and dose) information from a single structure in a wider range of radiation conditions and resist and stack properties. This improves the focus-dose measurement potential for resists and for more complex underlying topography. Apart from focus and dose, the additional information from more than two varying properties (e.g., CD and SWA) of the structure can be used to resolve other process or exposure parameters of interest.

The resultant focus- and dose-related measurements are fed back or fed forward to the exposure apparatus, which then compensates for any error in either measurement.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), and thin film magnetic heads. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool, and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the invention may be used in other applications such as, for example, imprint lithography and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure, or a combination thereof. The patterning device is moved out of the resist, leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic, and electrostatic optical components.

While specific embodiments of the invention have been described above, it will be appreciated that the invention may be practiced otherwise than as described. For example, embodiments of the present invention may take the form of a computer program containing one or more sequences of machine-readable instructions describing a method as disclosed above, or a data storage medium (e.g., semiconductor memory, magnetic, or optical disk) having such a computer program stored therein.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:
    printing a pattern on a substrate surface using an exposure apparatus and a patterning device including a pattern for creating the printed pattern, the patterning device pattern configured to generate the printed pattern that includes a structure that includes an asymmetry that varies with a variation in a focus focus-related property of the exposure apparatus;
    projecting a radiation beam onto the printed pattern on the substrate surface;
    detecting radiation reflected from the printed pattern on the substrate surface;
    measuring an asymmetry in the detected radiation reflected from the printed pattern; and
    determining, from the measured asymmetry, the focus-related property of the exposure apparatus.

2. The method according to claim 1, wherein the patterning device pattern is repeated in x and y directions in two dimensions.

3. The method according to claim 2, wherein the patterning device pattern comprises different physical or geometric properties in the x and y directions.

4. The method according to claim 1, wherein the detecting occurs in a pupil plane of a detector.

5. The method according to claim 1, further comprising determining an asymmetry of a detector used in the detecting by using two patterning means patterns that give rise to opposite asymmetry in the printed pattern.

6. The method according to claim 1, wherein the patterning device pattern comprises sub-resolution structures within the pattern that are not resolvable by the exposure apparatus such that said sub-resolution structures are not resolved in the printed pattern on the substrate surface.

7. The method according to claim 6, wherein
    the printing comprises directing a patterned radiation beam onto the substrate surface, and
    the determining comprises measuring a displacement of structures in the printed pattern caused by the sub-resolution structures in the patterning device pattern and determining an extent of defocus of the patterned radiation beam by referring to a predetermined relationship between defocus and the displacement of printed lines due to the sub-resolution structures.

8. The method of claim 1, wherein the asymmetry of the structure comprises a difference between two opposing side wall angles of the structure.

9. A mask comprising:
    a pattern for printing a pattern on a substrate,
    wherein the mask pattern is arranged such that the printed pattern contains a structure with side wall angle measurements that an asymmetry in the side wall angle measurements vary with a variation in a focus-related property of an exposure apparatus, and
    wherein includes two opposing side wall angles, a difference between the two opposing side wall angles increases with increasing defocus of an exposure radiation from the exposure apparatus, the difference between the two opposing side wall angles is detected based on an asymmetry in a detected radiation reflected from the printed pattern and is used to determine the focus-related property of the exposure apparatus.

10. The mask according to claim 9, wherein the mask pattern comprises structures that are not resolvable by the exposure apparatus and are not resolved in the printed pattern.

11. The mask according to claim 9, wherein the mask pattern comprises periodic dual line populations.

12. A substrate comprising:
    a pattern printed on its surface,
    wherein the printed pattern contains a structure with side wall angle measurements that an asymmetry in the side wall angle measurements vary with a variation in a focus-related property of an exposure apparatus that was used to print the pattern, and
    wherein the structure comprises two side walls, a difference between the angle of each of these side walls increases with an increase in defocus of an exposure radiation used to print the pattern, and the difference is detected based on an asymmetry in a detected radiation reflected from the printed pattern and is used to determine the focus-related property of the exposure apparatus.

13. An inspection system comprising:
    a patterning device including a pattern for printing on a substrate using an exposure apparatus, the printed pattern includes a structure that includes two opposing side wall angles and an asymmetry in the side wall angles varies with a variation in a focus-related property of the exposure apparatus; and
    an inspection apparatus configured to:
        project a radiation beam onto the printed pattern on the substrate;
        detect radiation reflected from the printed pattern on the substrate;
        measure an asymmetry in the detected radiation reflected from the printed pattern; and
        determine, from the measured asymmetry, the focus-related property of the exposure apparatus.

* * * * *

UNITED STATES PATENT AND TRADEMARK OFFICE
CERTIFICATE OF CORRECTION

PATENT NO. : 9,182,682 B2  
APPLICATION NO. : 13/140292  
DATED : November 10, 2015  
INVENTOR(S) : Cramer et al.

Page 1 of 1

It is certified that error appears in the above-identified patent and that said Letters Patent is hereby corrected as shown below:

IN THE CLAIMS

In column 18, line 11, claim 9, after "wherein", please insert --the structure--.

Signed and Sealed this  
Twenty-ninth Day of March, 2016

Michelle K. Lee  
*Director of the United States Patent and Trademark Office*